United States Patent
Aleksov et al.

(10) Patent No.: US 10,820,437 B2
(45) Date of Patent: Oct. 27, 2020

(54) FLEXIBLE PACKAGING FOR A WEARABLE ELECTRONIC DEVICE

(71) Applicant: Intel Corporation, Santa Clara, CA (US)

(72) Inventors: Aleksandar Aleksov, Chandler, AZ (US); Son V. Nguyen, Gilbert, AZ (US); Rajat Goyal, Chandler, AZ (US); David B. Lampner, Chandler, AZ (US); Dilan Seneviratne, Chandler, AZ (US); Albert S. Lopez, Tempe, AZ (US); Joshua D. Heppner, Chandler, AZ (US); Srinivas V. Pietambaram, Gilbert, AZ (US); Shawna M. Liff, Scottsdale, AZ (US); Nadine L. Dabby, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/335,050

(22) PCT Filed: Sep. 28, 2016

(86) PCT No.: PCT/US2016/054240
§ 371 (c)(1),
(2) Date: Mar. 20, 2019

(87) PCT Pub. No.: WO2018/063198
PCT Pub. Date: Apr. 5, 2018

(65) Prior Publication Data
US 2019/0281717 A1 Sep. 12, 2019

(51) Int. Cl.
*G06F 17/30* (2006.01)
*H05K 5/06* (2006.01)
(Continued)

(52) U.S. Cl.
CPC ............... *H05K 5/065* (2013.01); *G06F 1/16* (2013.01); *G06F 1/163* (2013.01); *G06F 1/18* (2013.01);
(Continued)

(58) Field of Classification Search
CPC ....................................................... H05K 5/00
See application file for complete search history.

(56) References Cited

U.S. PATENT DOCUMENTS

| 8,886,334 B2 | 11/2014 | Ghaffari et al. |
| 8,905,772 B2 | 12/2014 | Rogers et al. |

(Continued)

FOREIGN PATENT DOCUMENTS

| WO | WO-2014200428 A1 | 12/2014 |
| WO | WO-2015140392 A1 | 9/2015 |

(Continued)

OTHER PUBLICATIONS

"International Application Serial No. PCT/US2016/054240, International Search Report dated Jun. 16, 2017", 3 pgs.

(Continued)

*Primary Examiner* — Jerry Wu
(74) *Attorney, Agent, or Firm* — Schwegman Lundberg & Woessner, P.A.

(57) ABSTRACT

The document discloses a stretchable packaging system for a wearable electronic device. The system includes a first electronic component and a flexible trace connected to the first electronic component. An elastomer layer having a variable thickness at least partially encapsulates the first electronic component and the flexible trace. A first region of the layer has a first thickness that is greater than a second thickness of a second region of the layer that at least partially encapsulates the trace.

9 Claims, 6 Drawing Sheets

(51) Int. Cl.
  *H05K 5/00*   (2006.01)
  *H05K 5/02*   (2006.01)
  *G06F 1/18*   (2006.01)
  *G06F 1/16*   (2006.01)
  *G04G 17/04*  (2006.01)

(52) U.S. Cl.
  CPC ......... *H05K 5/0086* (2013.01); *H05K 5/0247* (2013.01); *G04G 17/04* (2013.01)

(56) References Cited

U.S. PATENT DOCUMENTS

| | | |
|---|---|---|
| 9,226,402 B2 | 12/2015 | Hsu |
| 2011/0138620 A1* | 6/2011 | Schaaf ................ H01L 21/4825 29/832 |
| 2013/0317130 A1 | 11/2013 | Brassard et al. |
| 2015/0313542 A1 | 11/2015 | Goldberg et al. |
| 2015/0342289 A1* | 12/2015 | Feng ........................ A43B 7/12 36/7.2 |
| 2016/0066812 A1 | 3/2016 | Cheng et al. |
| 2016/0066852 A1 | 3/2016 | Cheng et al. |
| 2016/0073503 A1 | 3/2016 | Singleton et al. |
| 2016/0358849 A1* | 12/2016 | Jur .......................... H01L 35/28 |

FOREIGN PATENT DOCUMENTS

| | | |
|---|---|---|
| WO | WO-2016074176 A1 | 5/2016 |
| WO | WO-2018063198 A1 | 4/2018 |

OTHER PUBLICATIONS

"International Application Serial No. PCT/US2016/054240, Written Opinion dated Jun. 16, 2017", 8 pgs.

* cited by examiner

FLEXIBLE PACKAGING FOR A WEARABLE ELECTRONIC DEVICE

CROSS-REFERENCE TO RELATED APPLICATION

This application is a U.S. National Stage Filing under 35 U.S.C. 371 from International Application No. PCT/US2016/054240, filed on Sep. 28, 2016, and published as WO 2018/063198 on Apr. 5, 2018, which application is incorporated herein by reference in its entirety.

BACKGROUND

Wearable electronic systems typically include two electronic components in communication with each other through an interconnection element. Typically, the system is encapsulated in a material. The encapsulating material may be chosen from a variety of materials. Factors that may drive the selection of a particular material include whether the material is comfortable when contacting the user. Various other factors include whether the material appears to be stylish to the user and whether the material is durable.

BRIEF DESCRIPTION OF THE FIGURES

In the drawings, which are not necessarily drawn to scale, like numerals describe substantially similar components throughout the several views. The drawings illustrate generally, by way of example, but not by way of limitation, various embodiments discussed in the present document.

DETAILED DESCRIPTION OF THE INVENTION

Figure 1:
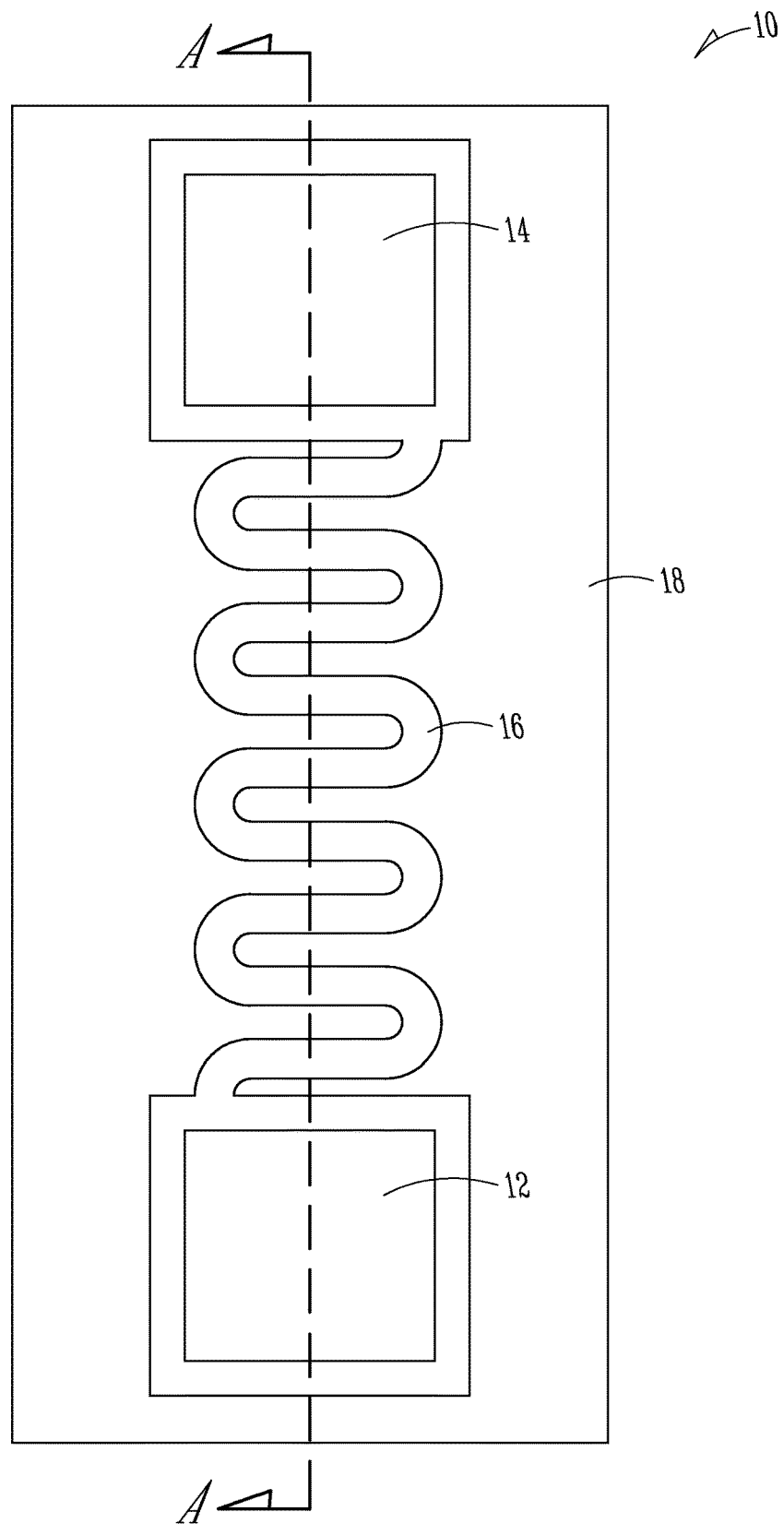
FIG. 1 is a top schematic view illustrating a stretchable packaging system for a wearable electronic device.

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts may be carried out in any order without departing from the principles of the invention, except when a temporal or operational sequence is explicitly recited. Furthermore, specified acts may be carried out concurrently unless explicit claim language recites that they be carried out separately. For example, a claimed act of doing X and a claimed act of doing Y may be conducted simultaneously within a single operation, and the resulting process will fall within the literal scope of the claimed process.

The term "about" as used herein may allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%.

The term "light" as used herein refers to electromagnetic radiation in and near wavelengths visible by the human eye, and includes ultra-violet (UV) light and infrared light, from about 10 nm to about 300,000 nm wavelength.

The term "cure" as used herein refers to exposing to radiation in any form, heating, or allowing to undergo a physical or chemical reaction that results in hardening or an increase in viscosity.

Figure 2:
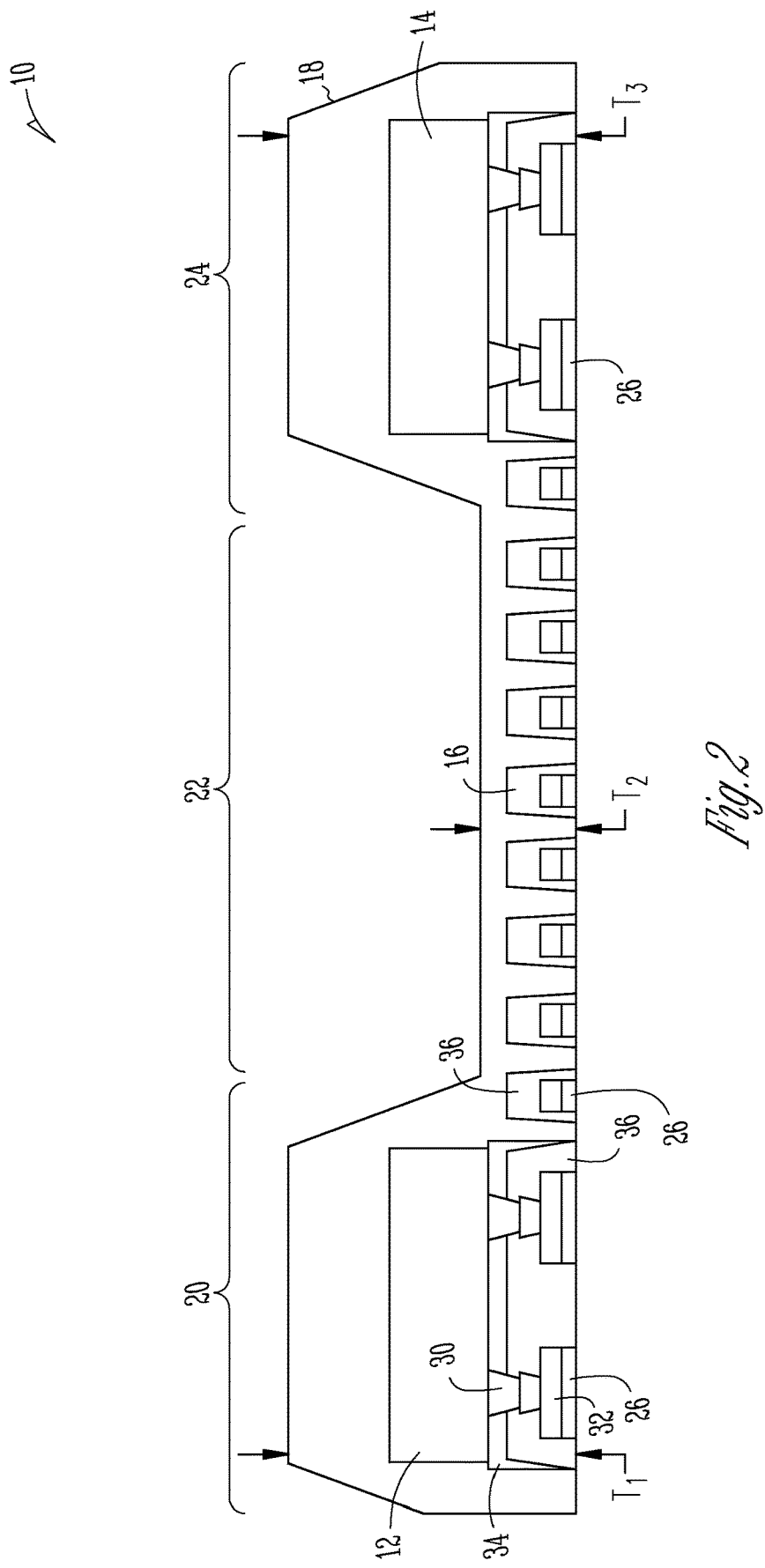
FIG. 2 is a schematic sectional view the system taken along line A-A of FIG. 1.

FIGS. 1 and 2 illustrate many of the same components and will be discussed together. FIG. 1 is a top schematic view illustrating a stretchable packaging system for a wearable electronic device. As illustrated, stretchable packaging system 10 includes first electronic component 12, second electronic component 14, flexible interconnection 16, and elastomer layer 18.

FIG. 2 is a schematic sectional view of system 10 taken along line A-A of FIG. 1. FIG. 2 illustrates many of the same components as FIG. 1 and additionally illustrates first region 20 of elastomer layer 18, second region 22 of elastomer layer 18, and third region 24 of elastomer layer 18. FIG. 2 additionally illustrates metal traces 26, solder interconnect 30, pad 32, epoxy underfill layer 34, and dielectric layer 36.

First and second electronic components 12 and 14 are in contact with solder interconnects 30. Solder interconnects 30 are coupled to pads 32, which are ultimately coupled to first and second electronic components 12 and 14. First and second electronic components 12 and 14 receive input and output signals through metal traces 26 that couple electronic components 12 and 14 to solder interconnects 30. First and second electronic components 12 and 14 may be many types of components. For example first and second electronic components 12 and 14 may be dies. The dies may be any suitable die including a memory die or central processing unit die. While the disclosure herein will refer to first and second electronic components 12 and 14 as dies, it is to be recognized and understood that the dies may be substituted for or included with microelectronic components generally, and that the various microelectronic components may be implemented according to the same or essentially the same principles disclosed herein. The microelectronic components may be or include, in addition or in the alternative to the dies discrete microelectronic components, such as capacitors, resistors, transistors, and the like, and/or may be or include a prepackaged die, chip assembly, systems in a package.

Flexible interconnection 16 is formed from traces 26 and connects first and second electronic components 12 and 14 and is formed from an electronically conductive material that allows for a transmission of a signal between components 12 and 14. Flexible interconnection 16 has a generally serpentine or meandering profile. Dielectric layer 36 may be applied to certain components of assembly 10 as required.

First and second electronic components 12 and 14 as well as flexible interconnection 16 are at least partially encapsulated by elastomer layer 18. Elastomer layer 18 may be formed from any suitable elastomer. Suitable elastomers include thermal plastic polyurethanes, butyl rubbers, polydimethyl siloxanes, and latexes. Additional elastomers may include polyisoprene, polybutadiene, cholorprene, styrene-butadiene, nitrile rubber, ethylene propylene rubber, ethylene propylene diene rubber, epichlorohydrin, polyacrylic rubber, silicone rubber, fluorosilicone rubber, fluoroelastomers, perfluoroelastomers, polyether block amides, cholorsulfonated polyethylene, ethylene-vinyl acetate, polysuflides. The choice of the elastomer may be driven by considerations such as the flexibility or durability of the elastomer. The choice of elastomer may additionally be driven by whether the elastomer forms a layer that is waterproof or at least water resistant.

Stretchable packaging system 10 is designed to be worn by a user.

In order to be wearable, system 10 may have many different shapes. For example, system 10 may have a band-like shape such as that of a watch band. Additionally, system 10 may be shaped like a patch so that system 10 may be incorporated into an article of clothing. Because system 10 is designed to be worn, system 10 must be able to accommodate stresses imparted to it by movement of the wearer. These stresses are likely to cause system 10 to be stretched. Components 12 and 14, however, may be damaged if, in response to these stresses, they are stretched too far. Flexible interconnection 16, however, is designed to stretch in response to these forces, and may therefore absorb these stresses. Elastomer layer 18 is accordingly, configured to better accommodate the ability to flexible interconnection 16 to stretch while keeping first and second components 12 and 14 relatively stiff or rigid in response to these stresses.

To accommodate the dispersion of these stresses between components that are to remain relatively rigid and those that may be flexible, elastomer layer 18 has a variable thickness as defined by first region 20, second region 22, and third region 24. First region 20 at least partially encapsulates first electronic component 12 and has a first thickness $t_1$ that is greater than a second thickness $t_2$ of second region 22 that at least partially encapsulates flexible interconnection 16. Third region 24 at least partially encapsulates second electronic component 14 and has a third thickness $t_3$ that is greater than the second thickness.

The variable thickness of elastomer layer 18 results in regions 20, 22, and 24 being stiffer or more flexible than each other. Whether a region is stiffer or more flexible depends on the thickness of the region. For example, first region 20 at least partially encapsulates first electronic component 12, which is configured to be stiff or rigid relative to flexible interconnection 16. Accordingly, first region 20 must be stiffer than second region 22. To achieve this, the first thickness may range from about 1.5 to about 10 times greater than the second thickness. Similarly, third region 24 at least partially encapsulates second electronic component 14. Second electronic component 14 is also configured to be stiff or rigid relative to flexible interconnection 16. Therefore, the third thickness may range from about 1.5 to about 10 times greater than the second thickness. In some embodiments, the first thickness and the third thickness may be substantially equivalent. In other embodiments, the first thickness and the second thickness may differ from each other. For example, the third thickness may be less than the first thickness. However, neither the first thickness nor the third thickness will be less than the second thickness.

Additionally, in some embodiments, the thickness within each region may vary. For example, first region 20 may have a maximum thickness and a minimum thickness, the minimum thickness, however, will be thicker than the second thickness of second region 22. Similarly, second region 22 may have a maximum thickness and a minimum thickness, however the maximum thickness will not be greater than a minimum thickness of first or third regions 20 and 24.

Figure 3:
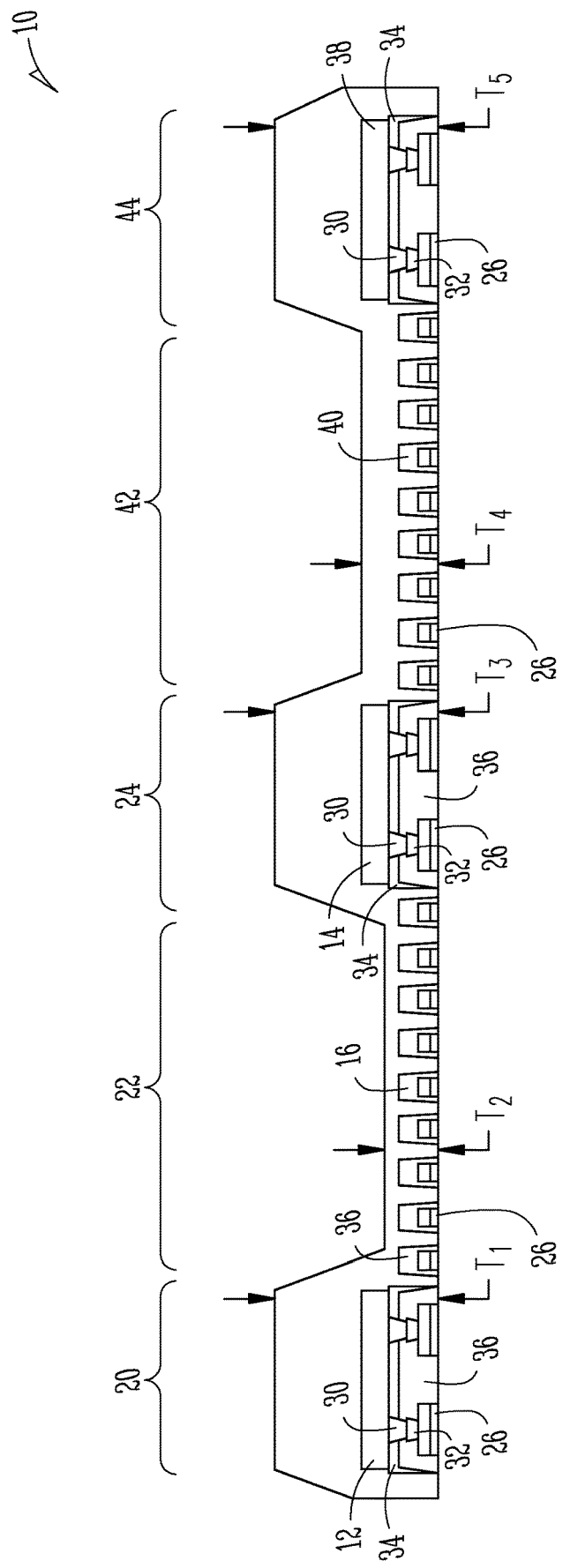
FIG. 3 is a schematic sectional view of another embodiment of the stretchable packaging system.

FIG. 3 is a schematic sectional view of another embodiment of stretchable packaging system 10. FIG. 3 illustrates many of the same components as described with respect to FIGS. 1 and 2 and additionally illustrates third electronic component 38 and second flexible interconnection 40. FIG. 3 additionally illustrates fourth region 42 and fifth region 44 of elastomer layer 18.

Third electronic component 38 communicates with second electronic component through second flexible interconnection 40. Fourth region 42 of elastomer layer 18 at least partially encapsulates the second flexible interconnection 40 and fifth region 44 at least partially encapsulates third electronic component 38. Fourth region 42 has a fourth thickness $t_4$.

Similar to second region 22, fourth region 42 is configured to be relatively stretchable. Therefore, fourth thickness $t_4$ may be substantially equivalent to the thickness of second region 22. In other embodiments, the fourth thickness may be greater or less than that of second region 22, but generally not thicker that the first or third thickness of first or third regions 20 and 24. Similar to second region 22, the thickness may vary across fourth region 42.

Similar to first region 20 and third region 24, fifth region 44 is configured to be relatively stiff or rigid compared to second and fourth regions 22 and 42. Therefore fifth thickness $t_5$ may be substantially equivalent to that of either first or third regions 20 and 24. The fifth thickness may also be greater or less than the thickness of first or third regions 20 and 24, but greater than the thickness of second region 22 or fourth region 42. Similar to first and third regions 20 and 24, the thickness may vary across fifth region 44.

It is to be understood that stretchable packaging system 10 as described with respect to FIGS. 1-3 is purely illustrative and that many configurations of system 10 are contemplated. In some embodiments system 10 may include only a single electronic component 12. In additional embodiments, elastomer layer 18 may encapsulate electronic components 12, 14, and 38 or flexible interconnections 16 and 40 to a greater or lesser extent. It is to be understood that system 10 is generally scalable and configurable in various ways that remain consistent with the systems and processes disclosed herein. Further, while the system 10 is described as an electronic system in contrast with a microelectronic assembly, it is to be understood that system 10 may itself be a microelectronic assembly and the microelectronic assembly may simply be a subcomponent of the larger microelectronic assembly. Similarly, the microelectronic assembly may be an electronic assembly, with such an electronic assembly being part of the larger system 10.

Figure 4:
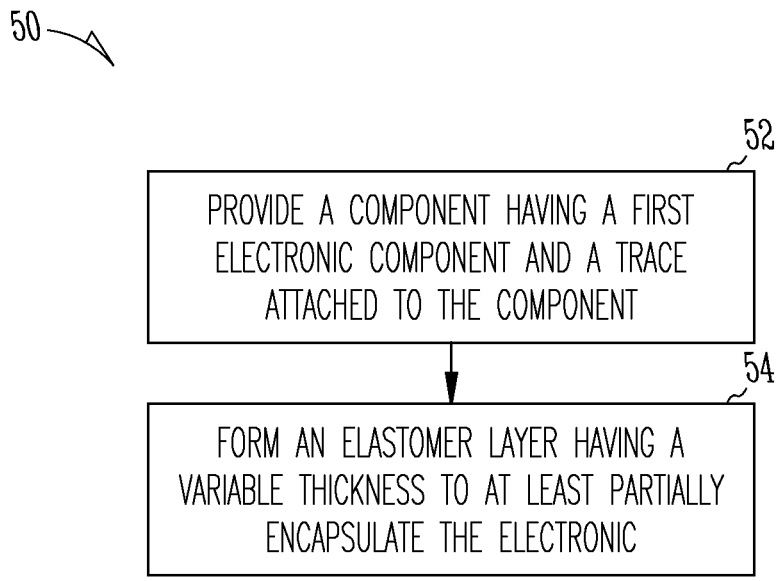
FIG. 4 is flow diagram generally illustrating a method of forming the system.

According to further embodiments of this disclosure a method of making a stretchable packaging system for a wearable electronic device is provided. FIG. 4 is flow diagram generally illustrating the method. As illustrated method 50 includes providing step 52 and formation step 54. In providing step 52, a component including first electronic component 12, and a trace is provided. In formation step 54 elastomer layer 18 is formed. Elastomer layer 18 is formed to have a variable thickness that at least partially encapsulates the component. More specifically, elastomer layer 18 is formed to include first region 20, which least partially encapsulates first electronic component 12 and has a first thickness. Elastomer layer 18 can be further formed to include second region 22, which at least partially encapsulates flexible interconnection 16 and has a second thickness that is less than the first thickness. Elastomer layer 18 is further formed to include third region 24, which at least partially encapsulates the second electronic component and has a third thickness greater than the second thickness.

Figure 5:
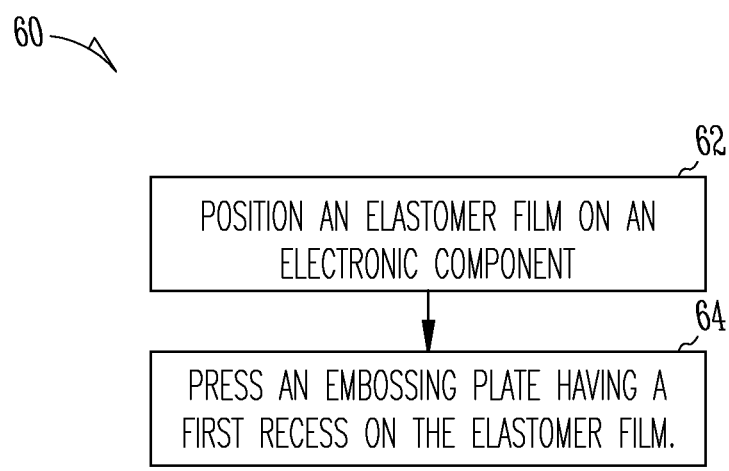
FIG. 5 is flow diagram generally illustrating the method of forming the system using an embossing plate.

As shown in FIG. 5, forming elastomer layer 18 may be performed according to lamination process 60 which includes positioning step 62 in which the elastomer is positioned on the component and the elastomer is a film. Process 60 further includes pressing step 64 in which an embossing plate is pressed on the elastomer. The embossing plate may be designed to have a first recess that is positioned over first electronic component 12 and a second recess that is positioned over second electronic component 14. Each recess may be closed on a top side and open on a bottom side. If the recess is open or at least has an opening on the top side, then a user may see through the recess which may help the use to align the embossing plate properly.

In other embodiments of the present invention forming elastomer layer 18 may include heating the elastomer to a temperature equal to or greater than a melting temperature of the elastomer. The elastomer may then be cooled to a temperature that is less than the melting temperature of the elastomer. Once the elastomer is cooled, the embossing plate is removed from the elastomer. In order to help prevent the embossing plate and elastomer from adhering to each other an anti-stick sheet may be placed between the embossing plate and the elastomer. The anti-stick sheet may be formed from polytetrafluoroethylene. In some embodiments of the present invention the embossing plate and the component may located between a first and second press plate. This process may be performed in a chamber. In some embodiments the chamber is evacuated, which may help to prevent air entrapment during the embossing process.

Figure 6:
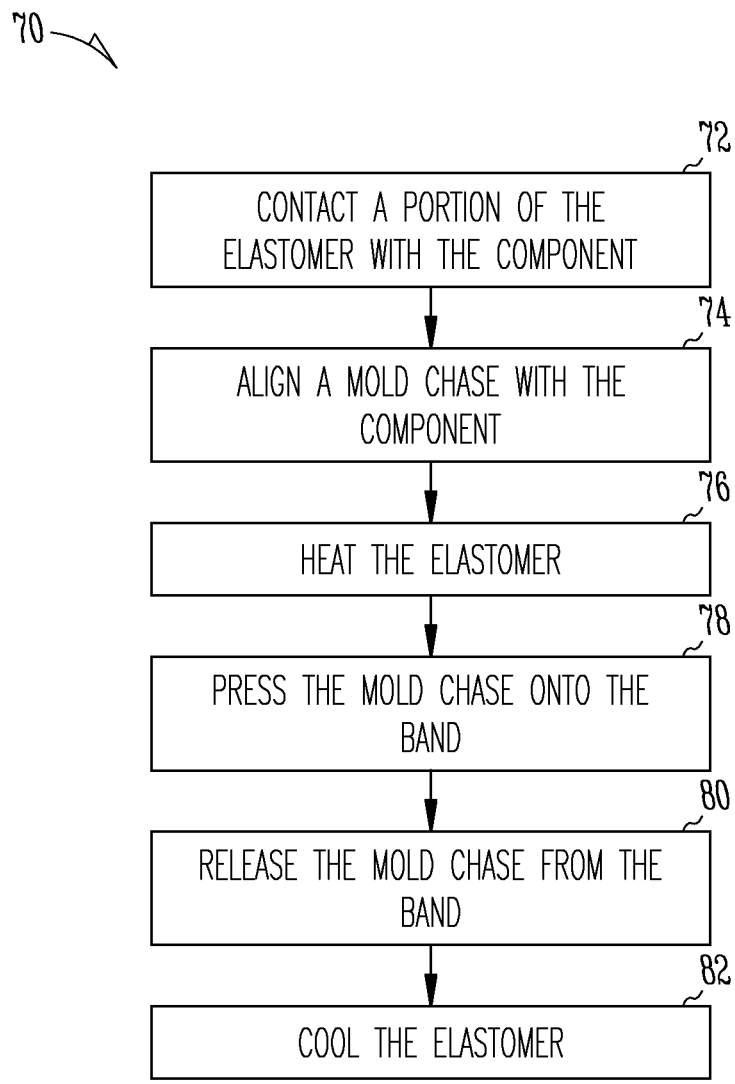
FIG. 6 is flow diagram generally illustrating the method of forming the system using a mold chase.

As shown in FIG. 6 in other embodiments of the present invention forming elastomer layer 18 may include molding process 70. In contacting step 72 of process 70, a portion of the elastomer is contacted with the component. In alignment step 74 a mold chase is aligned with the component. More specifically a recess of the mold chase is aligned with the elastomer. In heating step 76 elastomer is heated to a temperature equal to or greater than a melting temperature of the elastomer. In pressing step 78 the mold chase is pressed onto the band, which forces the molten elastomer to spread over the band. In releasing step 80 the mold chase is released from the band. In cooling step 82 the elastomer is cooled to a temperature below the melting temperature of the elastomer. If necessary the elastomer may be cured using one of, ultra-violet radiation, visible light, infrared irradiation, or by heating the elastomer.

In other embodiments a mold chase, including cavities, is aligned with the component. The space between the cavities and the component are evacuated and liquid elastomer is injected in to the cavities. The liquid elastomer is then cooled.

In other embodiments of the present invention forming elastomer layer 18 may include depositing the elastomer in a liquid phase over at least a portion of the component. The elastomer is subsequently cured using one of, ultra-violet radiation, visible light, infrared irradiation, or by heating the elastomer.

Figure 7:
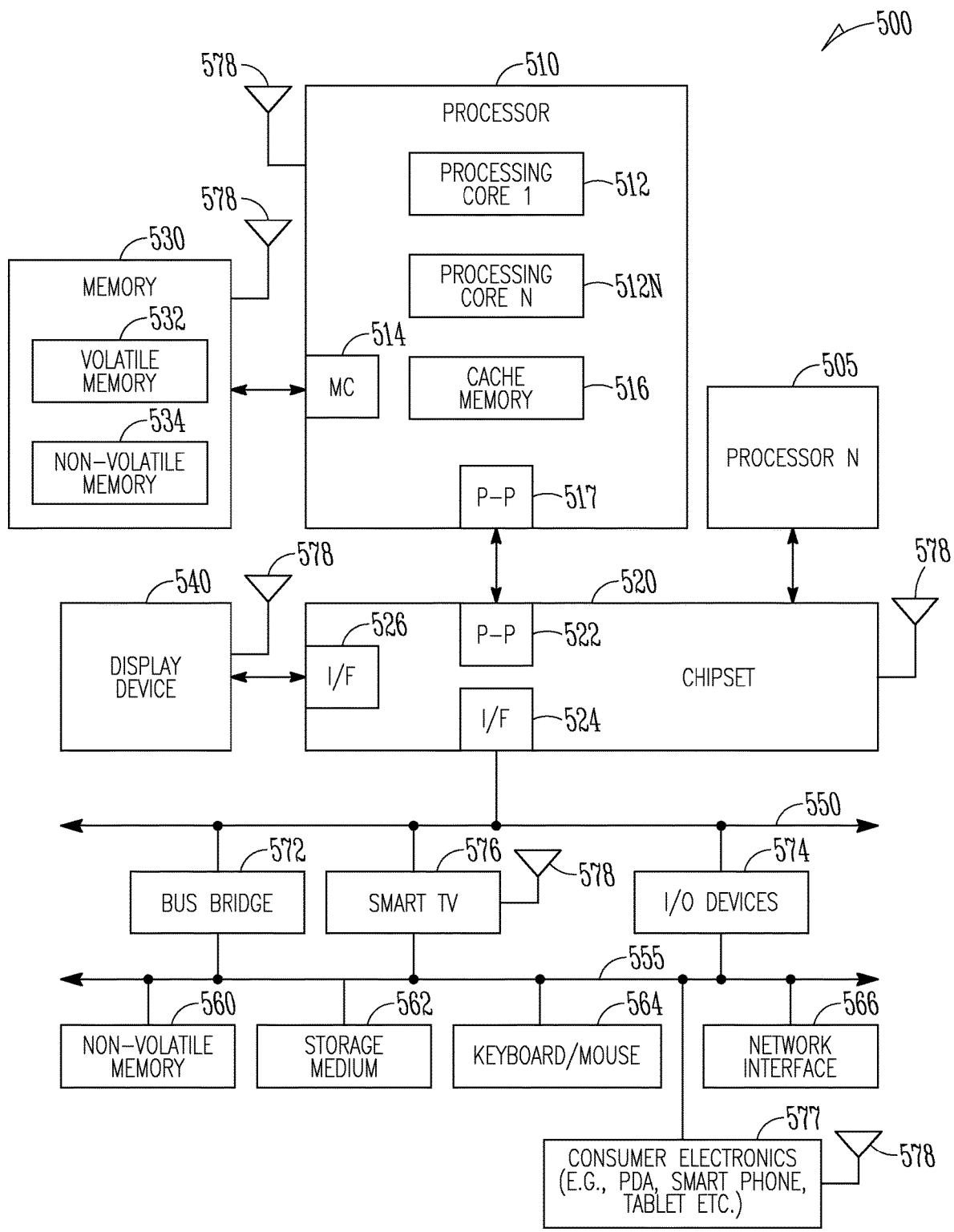
FIG. 7 is block diagram of an electronic system, according to an embodiment.

FIG. 7 illustrates a system level diagram, according to an embodiment of the invention. For instance, FIG. 7 depicts an example of an electronic device (e.g., system) including stretchable packaging system 10, which includes first electronic component 12, second electronic component 14, flexible interconnection 16, and elastomer layer 18. FIG. 7 is included to show an example of a higher level device application for the present invention. In an embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 is a system on a chip (SOC) system.

In an embodiment, processor 510 has one or more processing cores 512 and 512N, where 512N represents the Nth processor core inside processor 510 where N is a positive integer. In an embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 578 to communicate with any device configured to transmit and/or receive wireless signals. In an embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In an embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the invention, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505N, display device 540, and other devices 572, 576, 574, 560, 562, 564, 566, 577, etc. Chipset 520 may also be coupled to a wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the invention, processor 510 and chipset 520 are merged into a single SOC. In addition, chipset 520 connects to one or more buses 550 and 555 that interconnect various elements 574, 560, 562, 564, and 566. Buses 550 and 555 may be interconnected together via a bus bridge 572. In an embodiment, chipset 520 couples with a non-volatile memory 560, a mass storage device(s) 562, a keyboard/mouse 564, and a network interface 566 via interface 524 and/or 504, smart TV 576, consumer electronics 577, etc.

In an embodiment, mass storage device 562 includes, but is not limited to, a solid state drive, a hard disk drive, a universal serial bus flash memory drive, or any other form of computer data storage medium. In an embodiment, network interface 566 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In an embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) may be incorporated into processor core 512.

Various embodiments of the present invention may have certain advantages, some of which are unexpected. For example the varying thickness of elastomer layer 18 concentrates the strain caused by stresses imparted to system 10 in stretchable areas that were designed for it, while reducing strain in areas that are not desired to stretch. In contrast systems with a substantially uniform thickness across an elastomer layer or other encapsulating layer do not concentrate strain in different areas. As a result areas that were not designed to stretch may stretch and be damaged. Therefore the mechanical reliability and durability of systems having a varying thickness of elastomer layer 18 are greatly improved by comparison. Specifically, varying the thickness across elastomer layer 18 systems show increased durability in cyclical stretching tests and in single stretching strength tests. For example, various embodiments of system ten may show an increase in durability of approximately 3 to 10 times that of a system that does not have a varying thickness.

Additional Examples

The following exemplary examples are provided, the numbering of which is not to be construed as designating levels of importance:

Example 1 includes subject matter for a stretchable packaging system for a wearable electronic device (such as a device, apparatus, or machine) comprising: a first electronic component; a flexible trace connected to the first electronic component; and an elastomer layer having a variable thickness and at least partially encapsulating the first electronic component and the flexible trace; wherein a first region of the layer at least partially encapsulates the first and has a first thickness that is greater than a second thickness of a second region of the layer that at least partially encapsulates the flexible trace.

In Example 2, the subject matter of Example 1 may include, a second electronic component connected to the flexible trace, wherein a third region of the elastomer layer at least partially encapsulates the second electronic component has a third thickness that is greater than the second thickness.

In Example 3, the subject matter of at least one of Examples 1-2 may include, and a third electronic component and a second flexible interconnection between the third electronic component and the second electronic component.

In Example 4, the subject matter of any one of Examples 1 to 3 may include, wherein a fourth region of the elastomer at least partially encapsulates the second flexible interconnection and a fifth region of the elastomer at least partially encapsulates the third electronic component.

In Example 5, the subject matter of any one of Examples 1 to 4 may include, wherein the fourth region of the elastomer has a fourth thickness that is equal to the second thickness.

In Example 6, the subject matter of any one of Examples 1 to 5 may include, wherein the first thickness ranges from about 1.5 to about 5 times greater than the thickness of the second thickness.

In Example 7, the subject matter of any one of Examples 1 to 6 may include, wherein the thickness of each of the first, second, or third regions is variable within the respective region.

In Example 8, the subject matter of any one of Examples 1 to 7 may include, wherein the third thickness is greater than the first thickness.

In Example 9, the subject matter of any one of Examples 1 to 8 may include, wherein the fourth thickness is less than the second thickness.

In Example 10, the subject matter of any one of Examples 1 to 9 may include, wherein the fourth thickness is greater than the second thickness, but less than the first thickness.

In Example 11, the subject matter of any one of Examples 1 to 10 may include, wherein the second region is more stretchable than the first region or the third region.

In Example 12, the subject matter of any one of Examples 1 to 11 may include, wherein the flexible interconnection has a generally serpentine shape.

In Example 13, the subject matter of any one of Examples 1 to 12 may include, wherein the third thickness is less than the first thickness.

In Example 14, the subject matter of any one of Examples 1 to 13 may include, wherein the flexible interconnection is formed from a metal that is coated with a dielectric material.

In Example 15, the subject matter of any one of Examples 1 to 14 may include, wherein the first region is configured to remain substantially stiff relative to the second region.

In Example 16, the subject matter of any one of Examples 1 to 15 may include, wherein the elastomer is chosen from, thermal plastic polyurethanes, butyl rubber, poly-dimethyl siloxanes, and latex.

In Example 17, the subject matter of any one of Examples 1 to 16 may include, wherein the elastomer material is waterproof.

In Example 18, the subject matter of any one of Examples 1 to 17 may include, wherein the elastomer material is substantially water resistant.

In Example 19, the subject matter of any one of Examples 1 to 18 may include, wherein the system shows an increase in reliability in cyclical stretch testing compared to a system that does not include an elastomer having a variable thickness.

Example 20 includes subject matter for a wearable electronic system (such as a device, apparatus, or machine) comprising: a band comprising: a first stiffened portion; a second stiffened portion; and a flexible interconnection portion connecting the first and second stiffened portion; an elastomer strip at least partially encapsulating the band, the strip comprising: a first region at least partially encapsulating the first stiffened portion and having a first thickness; a second region at least partially encapsulating the second flexible portion and having a second thickness that is less than the first thickness; a third region at least partially encapsulating the third flexible portion and having a third thickness that is greater than the second thickness; a first electronic component attached to the first stiffened portion; and a second electronic component attached to the second stiffened portion.

In Example 21, the subject matter of Example 20 may include, wherein the flexible interconnection has a generally serpentine shape.

In Example 22, the subject matter of any one of Examples 20 to 21 may include, wherein the second region is more stretchable than the first region.

In Example 23, the subject matter of any one of Examples 21 to 22 may include, wherein the first region is configured to remain substantially stiff relative to the second region.

In Example 24, the subject matter of any one of Examples 20 to 23 may include, wherein the first thickness ranges from about 1.5 to about 5 times the thickness of the second thickness.

In Example 25, the subject matter of any one of Examples 20 to 24 may include, wherein the elastomer material is waterproof.

In Example 26, the subject matter of any one of Examples 20 to 25 may include, wherein the elastomer material is substantially water resistant.

In Example 27, the subject matter of any one of Examples 20 to 26 may include, wherein the system shows an increase in reliability in cyclical stretch testing compared to a system that does not include an elastomer having a variable thickness.

Example 28 includes subject matter for making a stretchable packaging system for a wearable electronic device (such as a method, means for performing acts, machine readable medium including instructions that when performed by a machine cause the machine to performs acts, or an apparatus to perform) comprising: providing a component comprising: a first electronic component; and a trace attached to the first electronic component and the second electronic component, and forming an elastomer layer formed from an elastomer, having a variable thickness to at least partially encapsulate the first electronic component and the trace.

In Example 29, the subject matter of Example 28 may include, further comprising: providing a second electronic component attached to the trace; and partially encapsulating the second electronic component with the elastomer layer.

In Example 30, the subject matter of any one of Examples 28 to 29 may include, wherein the first region of the strip is less stretchable than the second region of the strip.

In Example 31, the subject matter of any one of Examples 28 to 30 may include, wherein forming the elastomer layer comprises: positioning the elastomer on the component, wherein the elastomer comprises a film; pressing an embossing plate on the elastomer, wherein the embossing plate has a first recess that is positioned over the first electronic component and a second recess that is positioned over the second electronic component.

In Example 32, the subject matter of any one of Examples 28 to 31 may include, wherein forming the layer comprises: heating the elastomer to a temperature equal to or greater than a melting temperature of the elastomer; cooling the elastomer to a temperature that is less than the melting temperature of the elastomer film; and retracting the embossing plate from the elastomer.

In Example 33, the subject matter of any one of Examples 28 to 32 may include, wherein forming the layer comprises: contacting a portion of the elastomer with the component; aligning a mold chase with the component, wherein a recess of the mold chase is aligned with the elastomer; heating the elastomer to a temperature equal to or greater than a melting temperature of the elastomer; pressing the mold chase onto the band; releasing the mold chase from the band; and cooling the elastomer to a temperature below the melting temperature of the elastomer.

In Example 34, the subject matter of any one of Examples 28 to 33 may include, wherein forming the layer comprises: contacting a portion of the elastomer with the component; aligning a mold chase with the component, wherein a recess of the mold chase is aligned with the elastomer; heating the elastomer to a temperature equal to or greater than a melting temperature of the elastomer; pressing the mold chase onto the band; releasing the mold chase from the band; and cooling the elastomer to a temperature below the melting temperature of the elastomer.

In Example 35, the subject matter of any one of Examples 28 to 34 may include, wherein forming the layer comprises: depositing the elastomer over at least a portion of the component, wherein the elastomer is in a liquid phase; and curing the elastomer.

In Example 36, the subject matter of any one of Examples 28 to 35 may include, wherein curing is performed using one of, ultra-violet radiation, visible light, and infrared irradiation.

In Example 37, the subject matter of any one of Examples 28 to 36 may include, wherein forming the layer comprises: positioning an anti-stick sheet between the embossing plate and the elastomer.

In Example 38, the subject matter of any one of Examples 28 to 37 may include, wherein the anti-stick sheet is Teflon.

In Example 39, the subject matter of any one of Examples 28 to 37 may include, wherein the embossing plate and the component are located between a first and second press plate.

The terms and expressions that have been employed are used as terms of description and not of limitation, and there is no intention in the use of such terms and expressions of excluding any equivalents of the features shown and described or portions thereof, but it is recognized that various modifications are possible within the scope of the embodiments of the present invention. Thus, it should be understood that although the present invention has been specifically disclosed by specific embodiments and optional features, modification and variation of the concepts herein disclosed may be resorted to by those of ordinary skill in the art, and that such modifications and variations are considered to be within the scope of embodiments of the present invention.

What is claimed is:

1. A stretchable packaging system for a wearable electronic device, comprising: a first electronic component, a second electronic component, a flexible interconnection comprising metal traces coated with a dielectric material and having a generally serpentine shape, connecting the first and second electronic components through an epoxy layer, and an elastomer layer having a variable thickness and at least partially encapsulating the first and second electronic components and the flexible interconnection, the elastomer chosen from, thermal plastic polyurethanes, butyl rubber, polydimethyl siloxanes, and latex, wherein a first region of the elastomer layer at least partially encapsulates the first electronic component and has a first thickness in a first direction from a top of the first electronic component that is greater than a second thickness of a second region of the elastomer layer that at least partially encapsulates the flexible interconnection in the first direction, and a third region of the elastomer layer that at least partially encapsulates the second electronic component has a third thickness in the first direction that is greater than the second thickness.

2. The system of claim 1, and further comprising a third electronic component and a second flexible interconnection between the third electronic component and the second electronic component.

3. The system of claim 2, wherein a fourth region of the elastomer at least partially encapsulates the second flexible inter connection and a fifth region of the elastomer at least partially encapsulates the third electronic component.

4. The system of claim 1, wherein the first thickness ranges from about 1.5 to about 10 times greater than the thickness of the second thickness.

5. The system of claim 1, wherein the thickness of each of the first, second, or third regions is variable within the respective region.

6. The system of claim 1, wherein the second region is more stretchable than the first region or the third region.

7. The system of claim 1, wherein the elastomer material is waterproof.

8. The system of claim 1, wherein the elastomer material is substantially water resistant.

9. The system of claim 1, wherein the flexible interconnection has a generally serpentine shape.

* * * * *